(12) United States Patent
Zundel et al.

(10) Patent No.: US 11,695,069 B2
(45) Date of Patent: *Jul. 4, 2023

(54) GATE CONTACT STRUCTURE FOR SEMICONDUCTOR DEVICE

(71) Applicant: Infineon Technologies AG, Neubiberg (DE)

(72) Inventors: Markus Zundel, Egmating (DE); Stefan Mieslinger, Kottgeisering (DE); Thomas Ostermann, Koestenburg (AT); Andrew Christopher Graeme Wood, St. Jakob im Rosental (AT)

(73) Assignee: Infineon Technologies AG, Neubiberg (DE)

( * ) Notice: Subject to any disclaimer, the term of this patent is extended or adjusted under 35 U.S.C. 154(b) by 143 days.

This patent is subject to a terminal disclaimer.

(21) Appl. No.: 17/316,067

(22) Filed: May 10, 2021

(65) Prior Publication Data

US 2021/0265497 A1    Aug. 26, 2021

Related U.S. Application Data

(63) Continuation of application No. 16/404,005, filed on May 6, 2019, now Pat. No. 11,018,250.

(51) Int. Cl.
  *H01L 29/78*    (2006.01)
  *H01L 29/417*   (2006.01)
  *H01L 29/423*   (2006.01)

(52) U.S. Cl.
  CPC .... *H01L 29/7813* (2013.01); *H01L 29/41741* (2013.01); *H01L 29/41775* (2013.01); *H01L 29/4232* (2013.01)

(58) Field of Classification Search
  CPC .......... H01L 29/7825; H01L 29/42336; H01L 29/42352; H01L 29/4236; H01L 29/41741; H01L 29/41775; H01L 29/402–407; H01L 27/11556; H01L 27/11582; H01L 29/66666; H01L 29/66909; H01L 29/7788; H01L 27/2454; H01L 29/7827; H01L 21/823487; H01L 21/823885; H01L 29/66712–66734; H01L 29/7802–7815; H01L 21/8224; H01L 21/82285;

(Continued)

(56) References Cited

U.S. PATENT DOCUMENTS 6,337,498 B1    1/2002   Hasegawa et al.
7,468,536 B2   12/2008   Parthasarathy
(Continued)

*Primary Examiner* — Nelson Garces
(74) *Attorney, Agent, or Firm* — Murphy, Bilak & Homiller, PLLC

(57) ABSTRACT

According to an embodiment of a semiconductor device, the semiconductor device includes: a first active cell area comprising a first plurality of parallel gate trenches; a second active cell area comprising a second plurality of parallel gate trenches; and a metallization layer above the first and the second active cell areas. The metallization layer includes: a first part contacting a semiconductor mesa region between the plurality of parallel gate trenches in the first and the second active cell areas; and a second part surrounding the first part. The second part of the metallization layer contacts the first plurality of gate trenches along a first direction and the second plurality of gate trenches along a second direction different from the first direction.

23 Claims, 7 Drawing Sheets

(58) Field of Classification Search
CPC ............ H01L 27/0652; H01L 27/0658; H01L 27/0664; H01L 27/0716; H01L 27/0755–0777; H01L 27/0821; H01L 27/0823–0828; H01L 29/66333–66348; H01L 29/732–7327; H01L 29/7371–7378; H01L 29/7395–7398
See application file for complete search history.

(56) References Cited

U.S. PATENT DOCUMENTS

| | | |
|---|---|---|
| 7,732,860 B2 | 6/2010 | Parthasarathy |
| 7,859,037 B2 | 12/2010 | Parthasarathy et al. |
| 8,022,456 B2 | 9/2011 | Parthasarathy et al. |
| 8,410,551 B2 | 4/2013 | Parthasarathy et al. |
| 8,816,433 B2 | 8/2014 | Parthasarathy et al. |
| 11,018,250 B2 * | 5/2021 | Zundel .............. H01L 29/41775 |
| 2005/0194629 A1 | 9/2005 | Henninger et al. |
| 2008/0197396 A1 | 8/2008 | Parthasarathy |
| 2011/0233605 A1 * | 9/2011 | Hsieh .................. H01L 29/4238 |
| | | 257/E29.198 |
| 2021/0151589 A1 * | 5/2021 | Shoji .................. H01L 29/4238 |

* cited by examiner

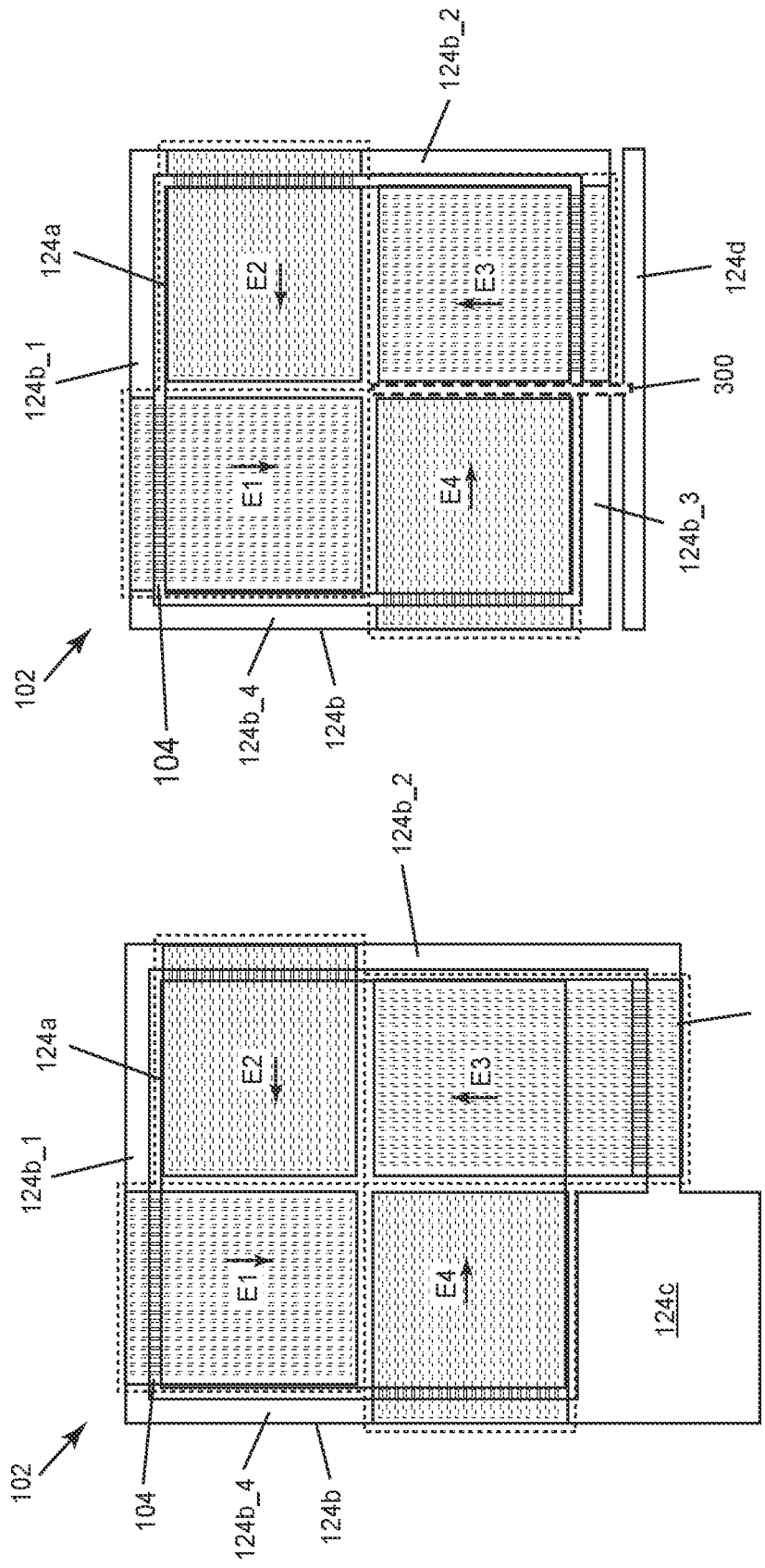

GATE CONTACT STRUCTURE FOR SEMICONDUCTOR DEVICE

BACKGROUND

Power field-effect transistor (FET) devices include multiple cell (active device) areas with gate trenches. The gate trenches may be arranged in groups which run lengthwise orthogonal to one another, to reduce stress within each die (chip) and across the wafer used to fabricate the dies. However, arranging groups of gate trenches in an orthogonal manner complicates the gate contact structure.

Thus, there is a need for an improved gate contact structure for power FET devices.

SUMMARY

According to an embodiment of a semiconductor device, the semiconductor device comprises: a first group of gate trenches formed in a semiconductor substrate and extending lengthwise in parallel in a first direction, each gate trench of the first group comprising a gate electrode above and electrically isolated from a field electrode; a second group of gate trenches formed in the semiconductor substrate and extending lengthwise in parallel in a second direction transverse to the first direction, each gate trench of the second group comprising a gate electrode above and electrically isolated from a field electrode; and a first metallization layer overlying the semiconductor substrate and comprising a source contact structure and a gate contact structure electrically isolated from the source contact structure. The gate electrodes of the first group of gate trenches are electrically connected at a same end to a first branch of the gate contact structure which extends lengthwise in a direction orthogonal to the first direction. The gate electrodes of the second group of gate trenches are electrically connected at a same end by a second branch of the gate contact structure which extends lengthwise in a direction orthogonal to the second direction. The field electrodes of the first group of gate trenches are electrically connected to the source contact structure at an opposite end from which the gate electrodes of the first group are electrically connected to the first branch of the gate contact structure. The field electrodes of the second group of gate trenches are electrically connected to the source contact structure at an opposite end from which the gate electrodes of the second group are electrically connected to the second branch of the gate contact structure.

In one embodiment, the first metallization layer is separated from the semiconductor substrate by an insulating layer, the gate electrodes of the first group of gate trenches are electrically connected to the first branch of the gate contact structure through first contact openings which extend through the insulating layer, the gate electrodes of the second group of gate trenches are electrically connected to the second branch of the gate contact structure through second contact openings which extend through the insulating layer, the field electrodes of the first group of gate trenches are electrically connected to the source contact structure through third contact openings which extend through the insulating layer, and the field electrodes of the second group of gate trenches are electrically connected to the source contact structure through fourth contact openings which extend through the insulating layer.

The first branch of the gate contact structure may run between the first group of gate trenches and the second group of gate trenches, the first branch of the gate contact structure may be covered by an additional insulating layer, and a top metal layer in contact with the source contact structure of the first metallization layer may be separated from the first branch of the gate contact structure by the additional insulating layer.

Separately or in combination, the gate contact structure may be uninterrupted and form a closed loop, and the first branch and the second branch of the gate contact structure may be joined together.

Separately or in combination, the first direction may be orthogonal to the second direction.

Separately or in combination, the first metallization layer may comprise a gate pad connected to the gate contact structure, and the first group of gate trenches may be longer than the second group of trenches and laterally overlap with the gate pad.

Separately or in combination, the semiconductor device may further comprise a sensor formed in the semiconductor substrate between the first group of trenches and the second group of trenches.

Separately or in combination, the semiconductor device may further comprise: a third group of gate trenches formed in the semiconductor substrate and extending lengthwise in parallel in the second direction, each gate trench of the third group comprising a gate electrode above and electrically isolated from a field electrode, wherein the first direction is orthogonal to the second direction, wherein the third group of gate trenches is adjacent the second group of gate trenches, wherein the third group of gate trenches is shorter than the second group of gate trenches, and wherein the third group of gate trenches and the second group of gate trenches terminate facing the first group of gate trenches.

According to another embodiment of a semiconductor device, the semiconductor device comprises: a first quadrant of gate trenches formed in a semiconductor substrate and comprising four groups of stripe-shaped gate trenches extending lengthwise in directions which are transverse to one another; a second quadrant of gate trenches formed in the semiconductor substrate adjacent the first quadrant of gate trenches and comprising four groups of stripe-shaped gate trenches extending lengthwise in directions which are transverse to one another; and a first metallization layer overlying the semiconductor substrate and comprising a gate contact structure electrically connected to gate electrodes in the gate trenches of the first and the second quadrants, the gate contact structure having a branch which runs along each side of the first and the second quadrants of gate trenches, including a branch between the first and the second quadrants of gate trenches.

The branch of the gate contact structure between the first and the second quadrants of gate trenches may run uninterrupted along the entire length of the first and the second quadrants of gate trenches.

Separately or in combination, the branch of the gate contact structure between the first and the second quadrants of gate trenches may be interrupted along the length of the first and the second quadrants of gate trenches.

Separately or in combination, the first metallization layer may comprise a first source contact structure and a second source contact structure electrically isolated from the gate contact structure, the first source contact structure may be positioned above the first quadrant of gate trenches and electrically connected to field electrodes in the gate trenches of the first quadrant of gate trenches, and the second source contact structure may be positioned above the second quadrant of gate trenches and electrically connected to field electrodes in the gate trenches of the second quadrant of gate trenches.

The branch of the gate contact structure between the first and the second quadrants of gate trenches may run uninterrupted between the first source contact structure and the second source contact structure.

Separately or in combination, the first source contact structure and the second source contact structure may be electrically connected to one another by a metal bridge which extends through a break in the branch of the gate contact structure between the first and the second quadrants of gate trenches.

Separately or in combination, the branch of the gate contact structure between the first and the second quadrants of gate trenches may be covered by an insulating layer, and a top metal layer in contact with the first source contact structure and the second source contact structure of the first metallization layer may be separated from the branch of the gate contact structure between the first and the second quadrants of gate trenches by the insulating layer.

Separately or in combination, the first source contact structure of the first metallization layer may be adjacent a gate pad formed in the first metallization layer, and the first source contact structure may have a different shape than the second source contact structure.

According to another embodiment of a semiconductor device, the semiconductor device comprises: a first active cell area comprising a first plurality of parallel gate trenches; a second active cell area comprising a second plurality of parallel gate trenches; and a metallization layer above the first and the second active cell areas, the metallization layer comprising: a first part contacting a semiconductor mesa region between the plurality of parallel gate trenches in the first and the second active cell areas; and a second part surrounding the first part, wherein the second part of the metallization layer contacts the first plurality of gate trenches along a first direction and the second plurality of gate trenches along a second direction different from the first direction.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIGS. 3 through 7 illustrate respective plan views of further embodiments of a gate trench quadrant implementation for a power semiconductor device and having an improved gate contact structure.

DETAILED DESCRIPTION

The embodiments described herein provide an improved gate contact structure for power semiconductor devices. Groups of gate trenches run lengthwise in different directions, and contact is made to the groups of gate trenches in different directions.

Figure 1A:
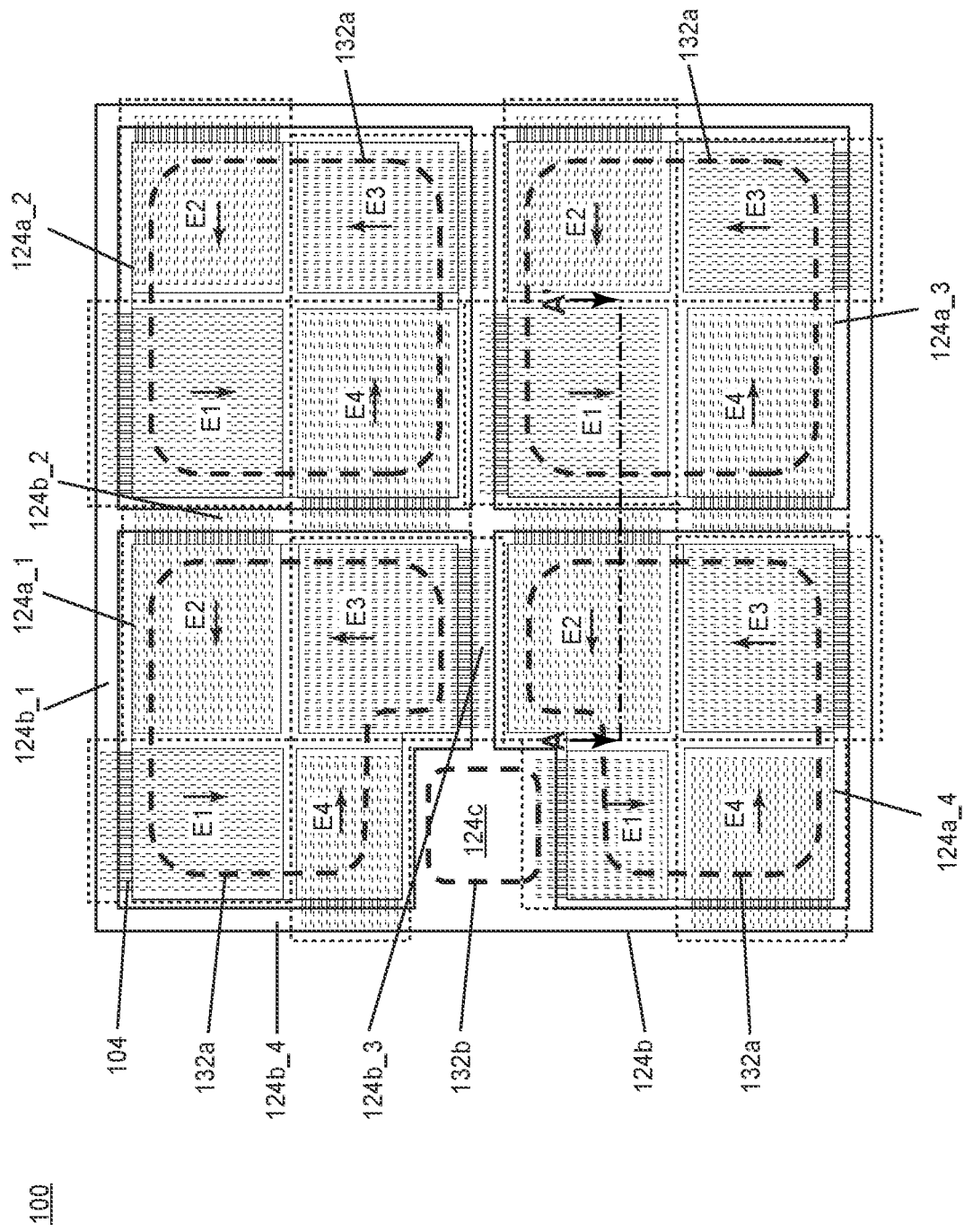
FIG. 1A illustrates a plan view of an embodiment of a power semiconductor device having an improved gate contact structure.
Figure 1B:
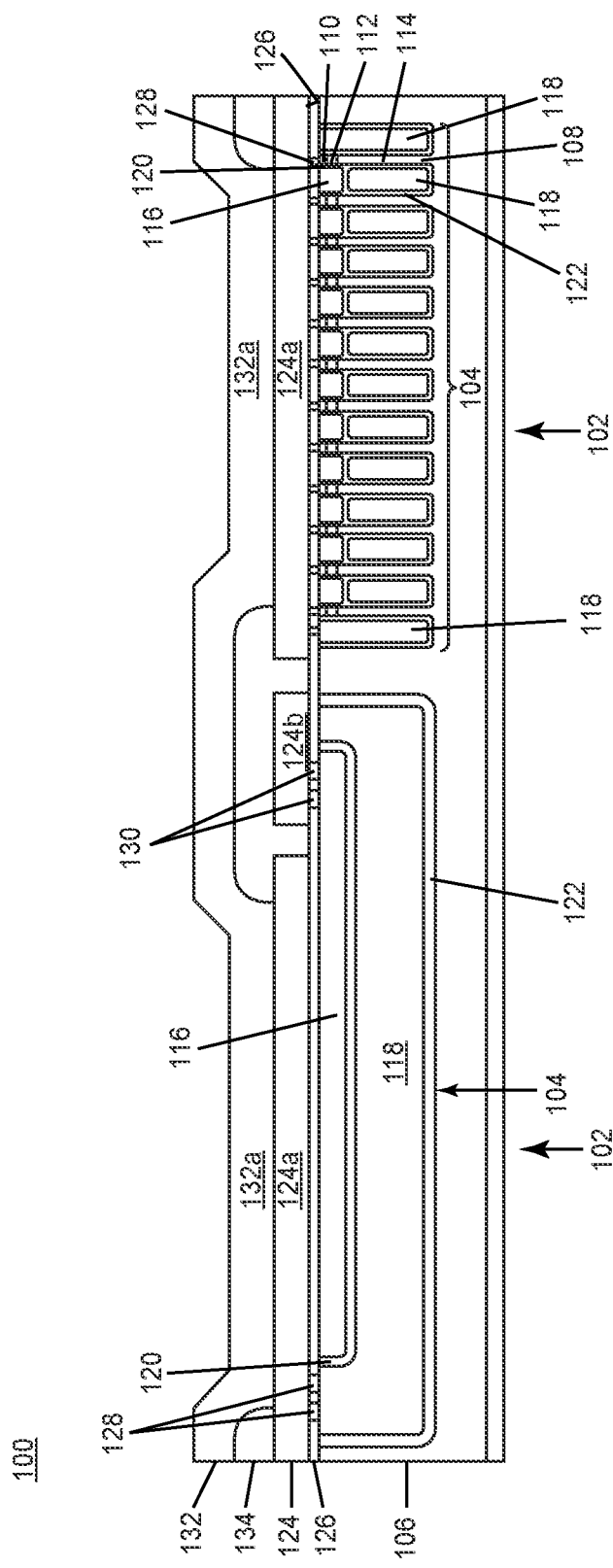
FIG. 1B illustrates a cross-sectional view of the power semiconductor device along the line labeled A-A' in FIG. 1A.

FIG. 1A illustrates an embodiment of a power semiconductor device 100 having an improved gate contact structure. FIG. 1B illustrates a cross-sectional view of the power semiconductor device 100 along the line labeled A-A' in FIG. 1A.

The power semiconductor device 100 includes a plurality of active cell areas 102. The active cell areas 102 are illustrated as rectangles with thin dashed lines in FIG. 1A. The term 'active cell area' as used herein refers to a region of the power semiconductor device which carries part of the load current of the device during device operation. The power semiconductor device 100 shown in FIGS. 1A and 1B is a vertical power device in that the load current flows vertically through the device in the active cell areas 102.

Each active cell area 102 of the power semiconductor device includes a plurality of parallel gate trenches 104 formed in a semiconductor substrate 106, with a semiconductor mesa region 108 between adjacent ones of the parallel gate trenches 104. A source region 110 of a first conductivity type and a body region 112 of a second conductivity type are formed in each semiconductor mesa region 108. A drift region 114 of the first conductivity type is formed below the body region 112. The body region 112 separates the source region 110 from the drift region 114. A voltage applied between the source region 110 and a gate electrode 116 in each adjacent gate trench 104 controls a conductive channel in the body region 112 and whether a current flows from the source region 110 to the drift region 114 through the body region 112 in each active cell area 102, as is well known in the semiconductor arts. The gate electrode 116 is above and electrically isolated from a field electrode 118 in the gate trenches 104 in each active cell area 102. The gate electrodes 116 are electrically insulated from the semiconductor substrate 106 by a gate dielectric 120, and the field electrodes 118 are electrically insulated from the semiconductor substrate 106 and from the gate electrodes 116 by a field dielectric 122 which is typically thicker than the gate dielectric 120.

A first metallization layer 124 overlying the semiconductor substrate 106 is positioned above the active cell areas 102 and separated from the semiconductor substrate 106 by an interlayer dielectric 126 such as oxide, nitride, etc. The first metallization layer 124 includes a first part 124a and a second part 124b surrounding the first part 124a. The first part 124a of the first metallization layer 124 is also referred to herein as source contact structure, and the second part 124b of the first metallization layer 124 is also referred to herein as gate contact structure.

The first part 124a of the first metallization layer 124 contacts the semiconductor mesa regions 108 between the parallel gate trenches 104 in each active cell area 102. The first part 124a of the first metallization layer 124 also contacts the field electrodes 118 at an end of the gate trenches 104 where the field electrodes 118 extend to the top surface 126 of the semiconductor substrate 106.

The second part 124b of the first metallization layer 124 contacts the parallel gate trenches 104 of one active cell area 102 along a first direction and the parallel gate trenches 104 of an adjacent active cell area 102 along a second direction different from the first direction. In one embodiment, the first direction is orthogonal to the second direction.

In each active cell area 102, the second part 124b of the first metallization layer 124 contacts the parallel gate trenches 104 at the opposite end of the gate trenches 104 at which the field electrodes 118 are contacted by the first part 124a of the first metallization layer 124. Contact openings formed in the interlayer dielectric 126 are filled with an electrically conductive material such as metal, metal alloy, doped polysilicon, etc. to form first contacts 128 between the source contact structure 124a and the field electrodes 118 and semiconductor mesa regions 108 of the active cell areas 102, and second contacts 130 between the gate contact structure 124b and the gate electrodes 116 of the active cell areas 102.

A second metallization layer 132 overlying the first metallization layer 124 is in contact with the source contact structure 124a to form source/body contact pads 132a which are electrically connected to the source region 110, the body region 112 and the field electrodes 118 of the active cell areas 102 through the first part 124a of the first metallization layer 124. An insulating material 134 such as imide, e.g., separates the second metallization layer 132 from the second part 124b of the first metallization layer 124 to prevent shorting between the source contact structure 124a and the gate contact structure 124b which are formed in the first metallization layer 124. A gate contact pad 132b is also formed in the second metallization layer 132 and electrically isolated from the source/body contact pads 132a. The gate contact pad 132b formed in the second metallization layer 132 is positioned above and contacts a gate pad 124c formed in the first metallization 124, through an opening in the insulating material 134 that separates the second metallization layer 132 from the first metallization layer 124.

External connections to the power semiconductor device 100 may be realized by bond wires, metal ribbons, metal clips, etc. which are attached to the contact pads 132a, 132b formed in the second metallization layer 132. The external connections are not shown in FIGS. 1A and 1B, and the second metallization layer 132 is not shown in FIG. 1A so as to not obstruct the view of the underlying structures. The contact pads 132a, 132b formed in the second metallization layer 132 are illustrated as thick dashed lines in FIG. 1A to indicate the position of the contact pads 132a, 132b relative to the source contact structure 124a, the gate contact structure 124b and the gate pad 124c formed in the first metallization layer 124.

According to the embodiment shown in FIGS. 1A and 1B, each active cell area 102 has four groups of parallel gate trenches 104, each group included in a dashed box in FIG. 1A. The first group of parallel gate trenches 104 extends lengthwise in parallel in a first direction E1, the second group of parallel gate trenches 104 extends lengthwise in parallel in a second direction E2, the third group of parallel gate trenches 104 extends lengthwise in parallel in a third direction E3, and the fourth group of parallel gate trenches 104 extends lengthwise in parallel in a fourth direction E4. The lengthwise extension direction of each group of parallel gate trenches 104 is transverse to the lengthwise extension direction of each adjacent group of parallel gate trenches 104.

In one embodiment, the gate trenches 104 in each group of parallel gate trenches 104 may extend lengthwise orthogonal with respect to the lengthwise extension direction of each adjacent group of parallel gate trenches 104. For example, in FIG. 1A, lengthwise gate trench extension direction E1 is orthogonal (i.e. approximately 90° angle) with respect to lengthwise gate trench extension directions E2 and E4. Lengthwise gate trench extension direction E2 is orthogonal with respect to lengthwise gate trench extension directions E1 and E3. Lengthwise gate trench extension direction E3 is orthogonal with respect to lengthwise gate trench extension directions E2 and E4. Lengthwise gate trench extension direction E4 is orthogonal with respect to lengthwise gate trench extension directions E1 and E3.

Further according to the embodiment shown in FIGS. 1A and 1B, in each active cell area 102 the gate electrodes 116 of each group of parallel gate trenches 104 are electrically connected at the same end to a branch 124b_X of the gate contact structure 124b which extends lengthwise in a direction orthogonal to the lengthwise extension direction of that group of parallel gate trenches 104. That is, for the upper-left quadrant of gate trench groups, the gate electrodes 116 of the group of parallel gate trenches 104 having the lengthwise extension direction E1 are electrically connected at the same end to a first branch 124b_1 of the gate contact structure 124b which extends lengthwise in a direction orthogonal to E1. The gate electrodes 116 of the group of parallel gate trenches 104 having the lengthwise extension direction E2 are electrically connected at the same end to a second branch 124b_2 of the gate contact structure 124b which extends lengthwise in a direction orthogonal to E2. The gate electrodes 116 of the group of parallel gate trenches 104 having the lengthwise extension direction E3 are electrically connected at the same end to a third branch 124b_3 of the gate contact structure 124 which extends lengthwise in a direction orthogonal to E3. The gate electrodes 116 of the group of parallel gate trenches 104 having the lengthwise extension direction E4 are electrically connected at the same end to a fourth branch 124b_4 of the gate contact structure 124b which extends lengthwise in a direction orthogonal to E4. The gate contact structure 124b has the same or similar configuration for the other quadrants of gate trench groups. The gate contact structure 124b may be uninterrupted and form an individual closed loop around each quadrant of gate trench groups and/or one closed loop around all quadrants of gate trench groups, so that the branches 124b_X of the gate contact structure 124b are joined together as shown in FIG. 1A.

Further according to the embodiment shown in FIGS. 1A and 1B, in each active cell area 102 the field electrodes 118 of each group of parallel gate trenches 104 are electrically connected to the source contact structure 124a at an opposite end from which the gate electrodes 116 of that group of parallel gate trenches 104 are electrically connected to the corresponding branch 124b_X of the gate contact structure 124b. That is, for the upper-left quadrant of gate trench groups, the field electrodes 118 of the group of parallel gate trenches 104 having the lengthwise extension direction E1 are electrically connected to the source contact structure 124a at the opposite end from which the gate electrodes 116 are electrically connected to the first branch 124b_1 of the gate contact structure 124b. The field electrodes 118 of the group of parallel gate trenches 104 having the lengthwise extension direction E2 are electrically connected to the source contact structure 124a at the opposite end from which the gate electrodes 116 are electrically connected to the second branch 124b_2 of the gate contact structure 124b. The field electrodes 118 of the group of parallel gate trenches 104 having the lengthwise extension direction E3 are electrically connected to the source contact structure 124a at the opposite end from which the gate electrodes 116 are electrically connected to the third branch 124b_3 of the gate contact structure 124b. The field electrodes 118 of the group of parallel gate trenches 104 having the lengthwise extension direction E4 are electrically connected to the source contact structure 124a at the opposite end from which the gate electrodes are electrically connected to the fourth branch 124b_4 of the gate contact structure 124b.

A branch 124b_X of the gate contact structure 124b may extend between adjacent active cell areas 102. For example, according to the embodiment illustrated in FIGS. 1A and 1B, the power semiconductor device 100 has four quadrants of gate trenches 104 formed in the semiconductor substrate 106, each quadrant of gate trenches 104 including four groups of stripe-shaped gate trenches 104 extending lengthwise in directions E1, E2, E3, E4 which are transverse to one another. The gate contact structure 124b formed in the first metallization layer 124 is electrically connected to the gate electrodes 116 in the gate trenches 104 of each quadrant, and has a branch 124b_X which runs along each side of each quadrant of gate trenches 104. This includes a branch between adjacent quadrants of gate trenches.

For example, in FIG. 1A, branch 124b_2 runs between the quadrants of gate trenches 104 on the left and right halves of FIG. 1A, and branch 124b_3 runs between the quadrants of gate trenches 104 on the top and bottom halves of FIG. 1A. In one embodiment, each branch 124b_X of the gate contact structure 124b formed in the first metallization layer 124 and positioned between adjacent quadrants of the gate trenches 104 runs uninterrupted along the entire length of adjacent quadrants of gate trenches 104, as shown in FIG. 1A.

The first part 124a of the first metallization layer 124 may be segmented into individual source contact structure 124a_X for each quadrant of gate trenches 104. The individual source contact structures 124a_X are electrically isolated from the gate contact structure 124b also formed in the first metallization layer 124. According to the embodiment illustrated in FIG. 1A, a first source contact structure 124a_1 is positioned above the quadrant of gate trenches 104 located in the upper left hand corner in FIGS. 1A and 1s electrically connected to field electrodes 118 in the gate trenches 104 of this quadrant of gate trenches 104. A second source contact structure 124a_2 is positioned above the quadrant of gate trenches 104 located in the upper right hand corner in FIGS. 1A and 1s electrically connected to field electrodes 118 in the gate trenches 104 of this quadrant of gate trenches 104. A third source contact structure 124a_3 is positioned above the quadrant of gate trenches 104 located in the lower right hand corner in FIGS. 1A and 1s electrically connected to field electrodes 118 in the gate trenches 104 of this quadrant of gate trenches 104. A fourth source contact structure 124a_4 is positioned above the quadrant of gate trenches 104 located in the lower left hand corner in FIGS. 1A and 1s electrically connected to field electrodes 118 in the gate trenches 104 of this quadrant of gate trenches 104. The individual source contact structures 124a_1, 124a_4 adjacent the gate pad 124c formed in the first metallization layer 124 may have a different shape than the source contact structures 124a_2, 124a_3 not adjacent the gate pad 124c, e.g., as shown in FIG. 1A.

The branches 124b_2, 124b_3 of the gate contact structure 124b positioned between adjacent quadrants of gate trenches 104 may run uninterrupted between the source contact structures 124a_1, 124a_2, 124a_3, 124a_4 positioned above those quadrants of gate trenches 104, e.g., as shown in FIG. 1A. The branches 124b_2, 124b_3 of the gate contact structure 124b positioned between adjacent quadrants of gate trenches 104 are covered by an insulating layer 134 such as imide, as explained above. The second metallization layer 132 contacts the individual source contact structures 124a_1, 124a_2, 124a_3, 124a_4 of the first metallization layer 124 positioned above the quadrants of gate trenches 104, and is separated from the branches 124b_2, 124b_3 of the gate contact structure 124b positioned between adjacent quadrants of gate trenches 104 by the insulating layer 134, as shown in FIG. 1B.

In one embodiment, the second metallization layer 124 is a top (uppermost) metal layer of the power semiconductor device 100 and the part 132a of the second metallization layer 132 in contact with the individual source contact structures 124a_1, 124a_2, 124a_3, 124a_4 of the first metallization layer 124 is formed as a single metal plate which covers the active cell areas 102 of the device 100. Such a source plate configuration has lower lateral resistance and therefore improves current spreading/homogeneity by not interrupting/dividing the source metallization. Such a source plate configuration also minimizes the risk of differential contact potentials to the individual source contact structures 124a_1, 124a_2, 124a_3, 124a_4 formed in the first metallization layer 124.

Figure 2:
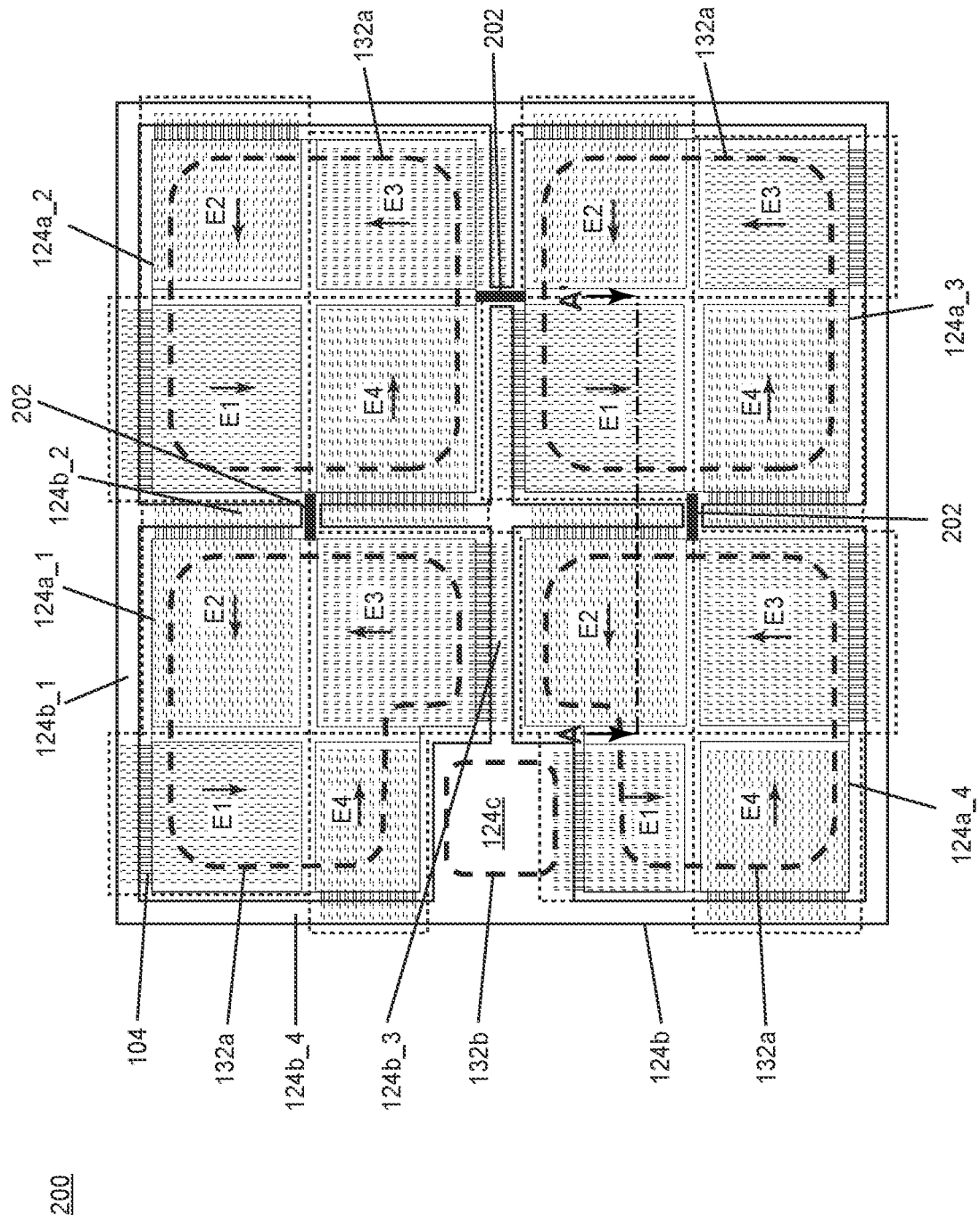
FIG. 2 illustrates a plan view of another embodiment of a power semiconductor device having an improved gate contact structure.

FIG. 2 illustrates another embodiment of a power semiconductor device 200 having an improved gate contact structure. The embodiment illustrated in FIG. 2 is similar to the embodiment illustrated in FIGS. 1A and 1B. Different, however, is that the branches 124b_2, 124b_3 of the gate contact structure 124b positioned between adjacent quadrants of gate trenches 104 are interrupted along the length of the adjacent quadrants of gate trenches 104. According to this embodiment, the source contact structures 124a_1, 124a_2, 124a_3, 124a_4 positioned above the quadrants of gate trenches 104 are electrically connected to one another by metal bridges 202 which extend through breaks in the branches 124b_2, 124b_3 of the gate contact structure 124b positioned between adjacent quadrants of gate trenches 104.

Electrically connecting the source contact structures 124a_1, 124a_2, 124a_3, 124a_4 using the metal bridges 202 formed in the first metallization layer 124 protects against gate oxide damage and avoids yield loss during testing of the power semiconductor device 200. During use of the device 200, electrically connecting the source contact structures 124a_1, 124a_2, 124a_3, 124a_4 using the metal bridges 202 formed in the first metallization layer 124 may provide protection, e.g., in the case of separate bond wire connections to each source/body contact pad 132a formed in the second metallization layer 132. If one set of bond wire connections is damaged, the metal bridges 202 formed in the first metallization layer 124 still provide an electrical connection to the affected active cell area 102 of the device 200. A sensor (not shown in FIG. 2) such as a current sensor may be formed in the semiconductor substrate 106 between adjacent groups of parallel trenches 104 in the same quadrant of gate trenches 104, or between quadrants of gate trenches 104. Such a sensor may detect a high impedance state for the active cell area 102 of the device 200 affected by the defective external connection and provide a warning. This way, corrective action such as powering down the device 200 can be taken before catastrophic failure occurs.

FIGS. 3 through 7 illustrate different embodiments of the gate trench quadrant implementation described above. Each quadrant of gate trenches 104 includes at least four groups of stripe-shaped gate trenches 104 extending lengthwise in a direction E1, E2, E3, E4 which is transverse to the lengthwise extension direction of the adjacent groups of stripe-shaped gate trenches 104. Each stripe-shaped gate trench 104 includes a gate electrode 116 above and electrically isolated from a field electrode 118, as explained above.

Figure 3:
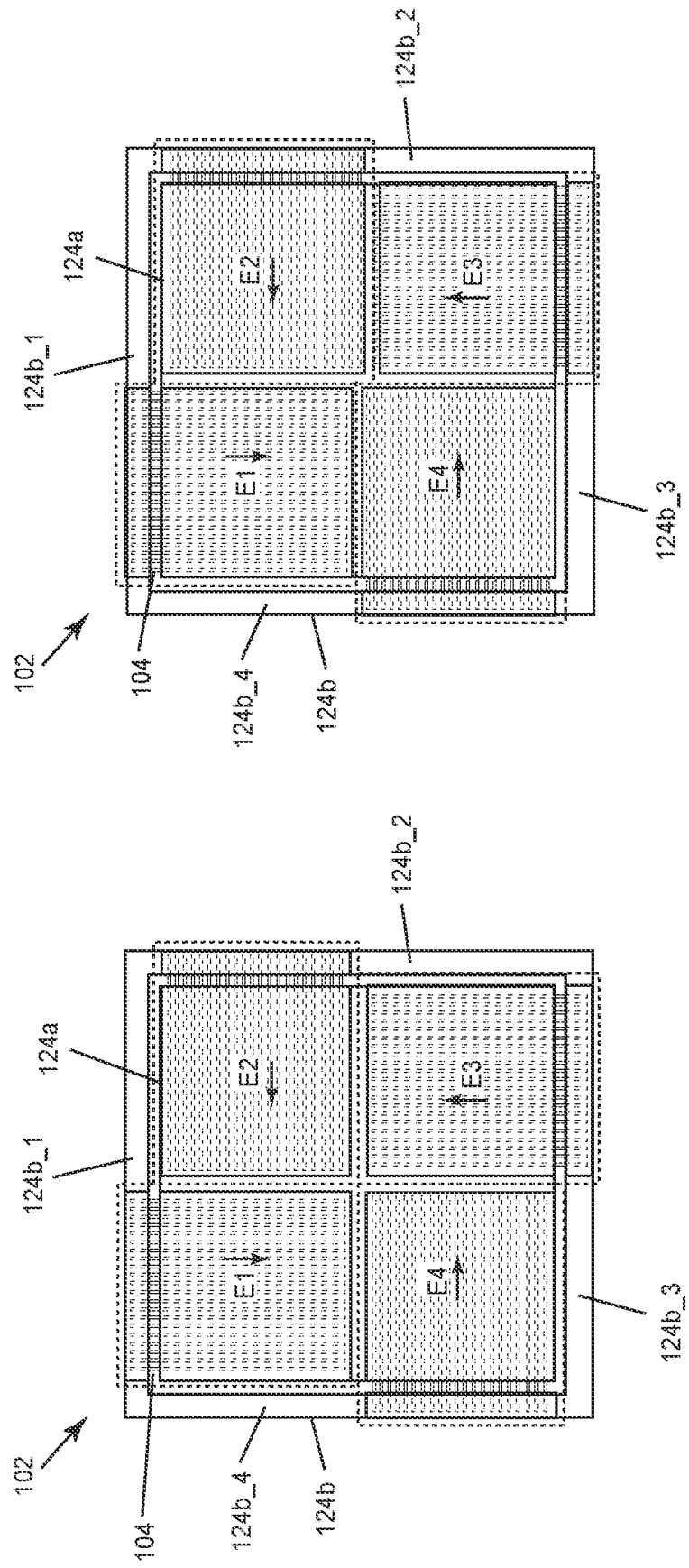

According to the gate trench quadrant embodiment illustrated in FIG. 3, each group of stripe-shaped gate trenches 104 occupies approximately the same size of active area 102 in the semiconductor substrate. For example, a ratio of the total length of all gate trenches 104 extending lengthwise in directions E1 and E3 to the total length of all gate trenches extending lengthwise in directions E2 and E4 is about 50/50, e.g., no more than about 55/45 or no less than 45/55.

Figure 4:
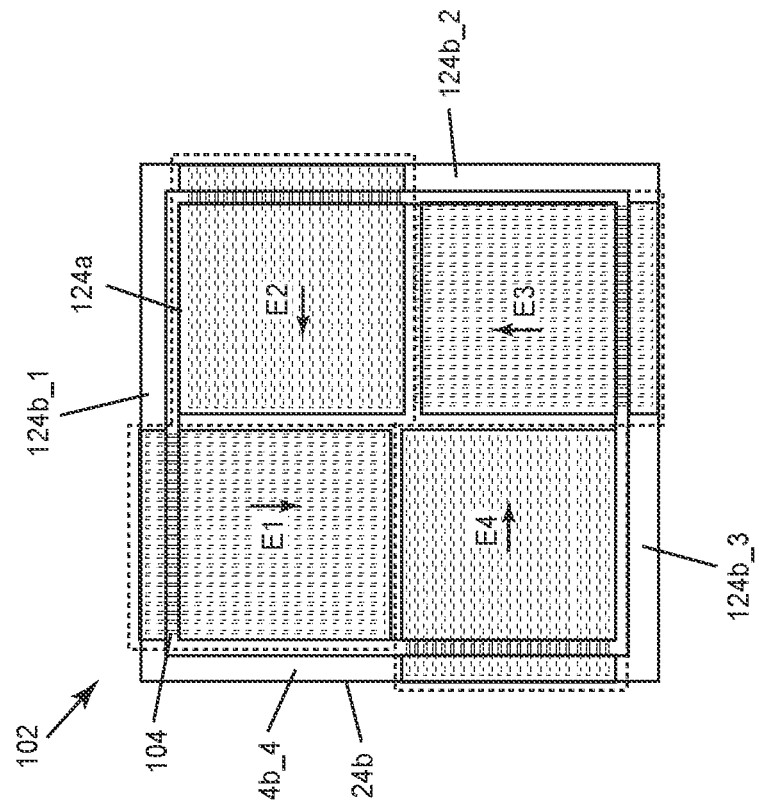

In FIG. 4, the groups of stripe-shaped gate trenches 104 are staggered or off-centered with respect to one another so that the groups of stripe-shaped gate trenches 104 do not meet or adjoin at the same point or corner.

In FIG. 5, however, the groups of stripe-shaped gate trenches 104 occupy different amounts of space in the active area 102 of the semiconductor substrate 106. For example, one group of the stripe-shaped gate trenches 104 may be longer than the other groups of stripe-shaped trenches 104 and laterally overlaps with the gate pad 124c formed in the first metallization layer 124.

Figure 9:
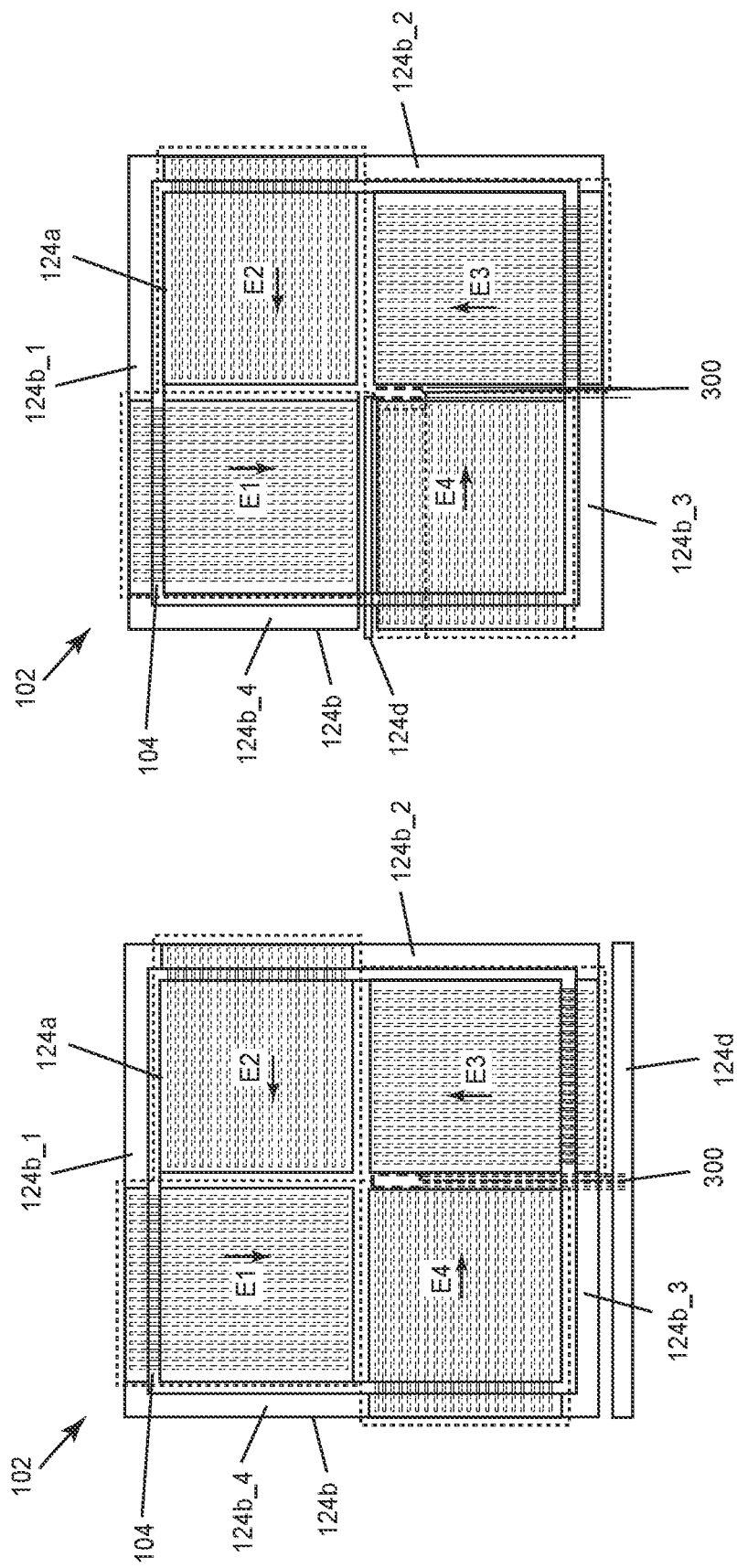
FIGS. 8 and 9 illustrate respective plan views of further embodiments each with a sensor implementation.
Figure 8:
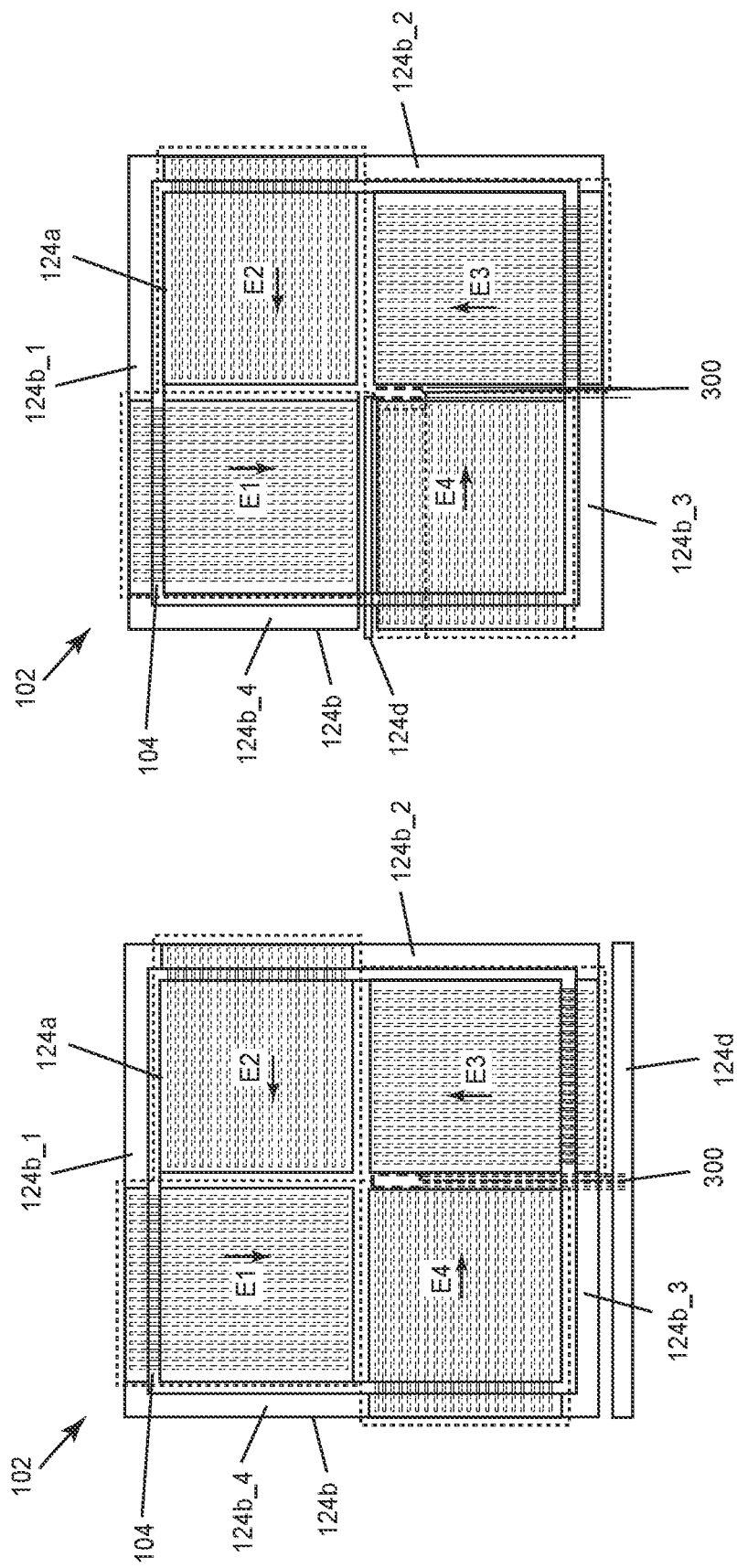

In FIG. 6, the group of the stripe-shaped gate trenches 104 having the lengthwise extension direction E4 occupies less space in the active area 102 of the semiconductor substrate 106 compared to the other groups of stripe-shaped gate trenches 104. Further according to this embodiment, a sensor 300 may be formed in the semiconductor substrate 106 between the shorter group of stripe-shaped trenches 104 and an adjacent group of stripe-shaped trenches 104, e.g., also as shown in FIGS. 8 and 9. That is, the sensor 300 is formed in the part of the semiconductor substrate 106 made available by reducing the size of the group of the stripe-shaped gate trenches 104 having the lengthwise extension direction E4. With this approach, die size is not increased to include the sensor 300.

The sensor 300 may be, for example, a current sensor having the same or similar construction as the power device cells. The sensor 300 is electrically connected to a branch 124d of the first metallization which is separated from the source contact structure 124a, so that the sensing path is isolated from the load current path. The sensor 300 is out of view in FIG. 6 and therefore illustrated as a rectangle with thick dashed lines to indicate the sensor position relative to the groups of the stripe-shaped gate trenches 104. The sensor 300 may occupy all or a part of the dashed region or even a different region of the quadrant having the lengthwise extension direction E4. For example, the sensor 300 may be placed in the center of the quadrant having the lengthwise extension direction E4, with the sensor contact branch 124d extending to the edge of the quadrant along the dashed rectangle. FIGS. 8 and 9 show additional embodiments for placement of the sensor 300 with respect to the quadrants of gate trenches 104.

Figure 7:
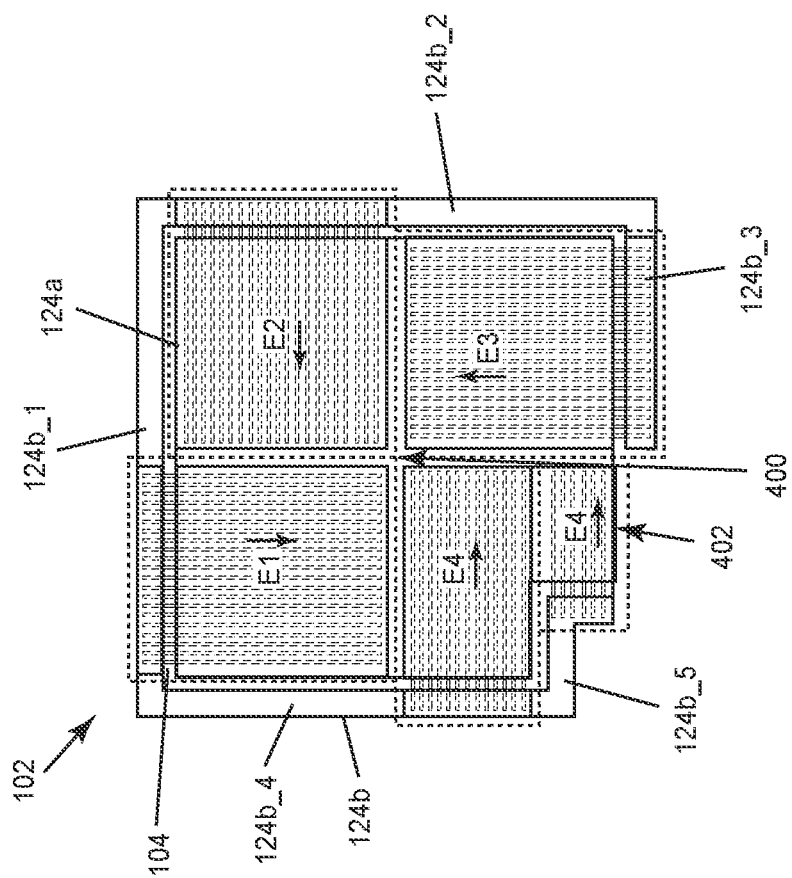

In FIG. 7, the groups of stripe-shaped gate trenches 104 are aligned so that the groups of stripe-shaped gate trenches 104 meet or adjoin at the same point or corner 400. Also, an additional group 402 of stripe-shaped gate trenches 104 is formed in the semiconductor substrate 106 and extends lengthwise in the same direction as the group of stripe-shaped gate trenches 104 which extends lengthwise in direction E4. Like the other groups of stripe-shaped gate trenches 104, each stripe-shaped gate trench 104 of the additional group 402 of stripe-shaped gate trenches 402 includes a gate electrode 116 above and electrically isolated from a field electrode 118 in the gate trench 104. Both groups of stripe-shaped gate trenches which extend lengthwise in direction E4 are adjacent to one another, and the additional group 402 of stripe-shaped gate trenches 104 is shorter than the adjacent group of stripe-shaped gate trenches 104 which also extends lengthwise in direction E4. Both groups of stripe-shaped gate trenches 104 which extend lengthwise in direction E4 terminate facing the group of stripe-shaped gate trenches 104 which extends lengthwise in direction E3. The gate contact structure 124b may include an additional branch 124b_5 electrically connected to the stripe-shaped gate trenches 104 of the additional group 402 of stripe-shaped gate trenches 104.

Terms such as "first", "second", and the like, are used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device, comprising:
  a first group of gate trenches formed in a semiconductor substrate and extending lengthwise in parallel in a first direction, each gate trench of the first group comprising a gate electrode electrically isolated from a field electrode;
  a second group of gate trenches formed in the semiconductor substrate and extending lengthwise in parallel in a second direction transverse to the first direction, each gate trench of the second group comprising a gate electrode electrically isolated from a field electrode; and
  a first metallization layer overlying the semiconductor substrate and comprising a first contact structure and a gate contact structure electrically isolated from the first contact structure,
  wherein the gate electrodes of the first group of gate trenches are electrically connected at a same end to a first branch of the gate contact structure which extends lengthwise in a direction orthogonal to the first direction,
  wherein the gate electrodes of the second group of gate trenches are electrically connected at a same end by a second branch of the gate contact structure which extends lengthwise in a direction orthogonal to the second direction,
  wherein the field electrodes of the first group of gate trenches are electrically connected to the first contact structure at an opposite end from which the gate electrodes of the first group are electrically connected to the first branch of the gate contact structure,
  wherein the field electrodes of the second group of gate trenches are electrically connected to the first contact structure at an opposite end from which the gate electrodes of the second group are electrically connected to the second branch of the gate contact structure.

2. The semiconductor device of claim 1, wherein the first metallization layer is separated from the semiconductor substrate by an insulating layer, wherein the gate electrodes of the first group of gate trenches are electrically connected to the first branch of the gate contact structure through first contact openings which extend through the insulating layer, wherein the gate electrodes of the second group of gate trenches are electrically connected to the second branch of the gate contact structure through second contact openings which extend through the insulating layer, wherein the field electrodes of the first group of gate trenches are electrically connected to the first contact structure through third contact openings which extend through the insulating layer, and wherein the field electrodes of the second group of gate trenches are electrically connected to the first contact structure through fourth contact openings which extend through the insulating layer.

3. The semiconductor device of claim 2, wherein the first branch of the gate contact structure runs between the first group of gate trenches and the second group of gate trenches, wherein the first branch of the gate contact structure is covered by an additional insulating layer, and wherein a top metal layer in contact with the first contact structure of the first metallization layer is separated from the first branch of the gate contact structure by the additional insulating layer.

4. The semiconductor device of claim 1, wherein the gate contact structure is uninterrupted and forms a closed loop, and wherein the first branch and the second branch of the gate contact structure are joined together.

5. The semiconductor device of claim 1, wherein the first direction is orthogonal to the second direction.

6. The semiconductor device of claim 1, wherein the first metallization layer comprises a gate pad connected to the gate contact structure, and wherein the first group of gate trenches is longer than the second group of trenches and laterally overlaps with the gate pad.

7. The semiconductor device of claim 1, further comprising a sensor formed in the semiconductor substrate between the first group of trenches and the second group of trenches.

8. The semiconductor device of claim 1, further comprising:
a third group of gate trenches formed in the semiconductor substrate and extending lengthwise in parallel in the second direction, each gate trench of the third group comprising a gate electrode electrically isolated from a field electrode,
wherein the first direction is orthogonal to the second direction,
wherein the third group of gate trenches is adjacent the second group of gate trenches,
wherein the third group of gate trenches is shorter than the second group of gate trenches, and
wherein the third group of gate trenches and the second group of gate trenches terminate facing the first group of gate trenches.

9. The semiconductor device of claim 1, wherein:
the gate electrodes of the first group of gate trenches are disposed above the field electrodes of the first group of gate trenches; and
the gate electrodes of the second group of gate trenches are disposed above the field electrodes of the second group of gate trenches.

10. The semiconductor device of claim 1, wherein the first contact structure is a source contact structure.

11. A semiconductor device, comprising:
a first quadrant of gate trenches comprising four groups of stripe-shaped gate trenches extending lengthwise in directions which are transverse to one another;
a second quadrant of gate trenches adjacent the first quadrant of gate trenches and comprising four groups of stripe-shaped gate trenches extending lengthwise in directions which are transverse to one another; and
a first metallization layer comprising a gate contact structure electrically connected to gate electrodes in the gate trenches of the first and the second quadrants, the gate contact structure having a branch which runs along each side of the first and the second quadrants of gate trenches, including a branch between the first and the second quadrants of gate trenches,
wherein the first metallization layer comprises a first source contact structure and a second source contact structure electrically isolated from the gate contact structure,
wherein the first source contact structure is positioned above the first quadrant of gate trenches and electrically connected to field electrodes in the gate trenches of the first quadrant of gate trenches,
wherein the second source contact structure is positioned above the second quadrant of gate trenches and electrically connected to field electrodes in the gate trenches of the second quadrant of gate trenches.

12. The semiconductor device of claim 11, wherein the branch of the gate contact structure between the first and the second quadrants of gate trenches runs uninterrupted along the entire length of the first and the second quadrants of gate trenches.

13. The semiconductor device of claim 11, wherein the branch of the gate contact structure between the first and the second quadrants of gate trenches is interrupted along the length of the first and the second quadrants of gate trenches.

14. The semiconductor device of claim 11, wherein the branch of the gate contact structure between the first and the second quadrants of gate trenches runs uninterrupted between the first source contact structure and the second source contact structure.

15. The semiconductor device of claim 11, wherein the first source contact structure and the second source contact structure are electrically connected to one another by a metal bridge which extends through a break in the branch of the gate contact structure between the first and the second quadrants of gate trenches.

16. The semiconductor device of claim 11, wherein the branch of the gate contact structure between the first and the second quadrants of gate trenches is covered by an insulating layer, and wherein a top metal layer in contact with the first source contact structure and the second source contact structure of the first metallization layer is separated from the branch of the gate contact structure between the first and the second quadrants of gate trenches by the insulating layer.

17. The semiconductor device of claim 11, wherein the first source contact structure of the first metallization layer is adjacent a gate pad formed in the first metallization layer, and wherein the first source contact structure has a different shape than the second source contact structure.

18. The semiconductor device of claim 11, further comprising a sensor between the first quadrant of gate trenches and the second quadrant of gate trenches.

19. A semiconductor device, comprising:
a first quadrant of gate trenches comprising four groups of stripe-shaped gate trenches extending lengthwise in directions which are transverse to one another;
a second quadrant of gate trenches adjacent the first quadrant of gate trenches and comprising four groups of stripe-shaped gate trenches extending lengthwise in directions which are transverse to one another; and a first metallization layer comprising a gate contact structure electrically connected to gate electrodes in the gate trenches of the first and the second quadrants, the gate contact structure having a branch which runs along each side of the first and the second quadrants of gate trenches, including a branch between the first and the second quadrants of gate trenches, wherein the branch of the gate contact structure between the first and the second quadrants of gate trenches is interrupted along the length of the first and the second quadrants of gate trenches.

20. A semiconductor device, comprising:
a first group of gate trenches formed in a semiconductor substrate and extending lengthwise in parallel in a first direction, each gate trench of the first group comprising a gate electrode above and electrically isolated from a field electrode;
a second group of gate trenches formed in the semiconductor substrate and extending lengthwise in parallel in a second direction transverse to the first direction, each gate trench of the second group comprising a gate electrode above and electrically isolated from a field electrode;
a sensor formed in the semiconductor substrate between the first group of trenches and the second group of trenches; and
a first metallization layer overlying the semiconductor substrate and comprising a source contact structure and a gate contact structure electrically isolated from the source contact structure,
wherein the gate electrodes of the first group of gate trenches are electrically connected at a same end to a first branch of the gate contact structure which extends lengthwise in a direction orthogonal to the first direction,
wherein the gate electrodes of the second group of gate trenches are electrically connected at a same end by a second branch of the gate contact structure which extends lengthwise in a direction orthogonal to the second direction,
wherein the field electrodes of the second group of gate trenches are electrically connected to the source contact structure at an opposite end from which the gate electrodes of the second group are electrically connected to the second branch of the gate contact structure.

21. A semiconductor device, comprising:
a first quadrant of gate trenches formed in a semiconductor substrate and comprising four groups of stripe-shaped gate trenches extending lengthwise in directions which are transverse to one another;
a second quadrant of gate trenches formed in the semiconductor substrate adjacent the first quadrant of gate trenches and comprising four groups of stripe-shaped gate trenches extending lengthwise in directions which are transverse to one another;
a first metallization layer overlying the semiconductor substrate and comprising a gate contact structure electrically connected to gate electrodes in the gate trenches of the first and the second quadrants, the gate contact structure having a branch which runs along each side of the first and the second quadrants of gate trenches, including a branch between the first and the second quadrants of gate trenches; and
a sensor formed in the semiconductor substrate between the first quadrant of gate trenches and the second quadrant of gate trenches.

22. The semiconductor device of claim 21, wherein the sensor is a current sensor.

23. A semiconductor device, comprising:
a quadrant of gate trenches formed in a semiconductor substrate and comprising four groups of stripe-shaped gate trenches extending lengthwise in directions which are transverse to one another; and
a first metallization layer overlying the semiconductor substrate and comprising a gate contact structure electrically connected to gate electrodes in the gate trenches of the quadrant of gate trenches, the gate contact structure having a branch which runs along each side of the quadrant of gate trenches,
wherein each of the four groups of stripe-shaped gate trenches has a corner region that faces a center of the quadrant of gate trenches and is staggered or off-centered with respect to the corner region of at least two neighboring groups of stripe-shaped gate trenches.

* * * * *